(12) United States Patent
Lee et al.

(10) Patent No.: US 8,894,477 B2
(45) Date of Patent: Nov. 25, 2014

(54) DISPLAY DEVICE

(75) Inventors: Yong-soo Lee, Seoul (KR); Min-soo Kim, Seoul (KR); Seung-won Shin, Seoul (KR); Ha-seung Chung, Seoul (KR); Moon-chul Lee, Seongnam-si (KR)

(73) Assignees: Samsung Electronics Co., Ltd., Suwon-Si (KR); Hongik Industry-Academia Cooperation Foundation, Seoul (KR)

( * ) Notice: Subject to any disclaimer, the term of this patent is extended or adjusted under 35 U.S.C. 154(b) by 279 days.

(21) Appl. No.: 12/956,185

(22) Filed: Nov. 30, 2010

(65) Prior Publication Data

US 2011/0162831 A1    Jul. 7, 2011

(30) Foreign Application Priority Data

Jan. 7, 2010   (KR) ........................ 10-2010-0001325

(51) Int. Cl.
*H05K 5/00* (2006.01)
*H05K 7/20* (2006.01)

(52) U.S. Cl.
CPC ................... *H05K 7/20972* (2013.01)
USPC .......................................... 454/184; 361/695

(58) Field of Classification Search
USPC ............ 454/193, 184, 189; 361/659, 679.01, 361/690, 695
See application file for complete search history.

(56) References Cited

U.S. PATENT DOCUMENTS

| | | | | |
|---|---|---|---|---|
| 3,680,468 | A | * | 8/1972 | Schueler ................... 454/324 |
| 5,869,919 | A | * | 2/1999 | Sato et al. .................. 313/17 |
| 6,043,979 | A | * | 3/2000 | Shim ..................... 361/695 |
| 6,164,369 | A | * | 12/2000 | Stoller ................. 165/104.33 |
| 6,198,222 | B1 | * | 3/2001 | Chang ..................... 313/582 |
| 6,299,526 | B1 | * | 10/2001 | Cowan et al. ............... 454/184 |
| 6,330,154 | B1 | * | 12/2001 | Fryers et al. ............... 361/695 |
| 6,476,883 | B1 | * | 11/2002 | Salimes et al. .............. 349/58 |
| 6,480,243 | B2 | * | 11/2002 | Yamamoto ................. 348/836 |
| 6,876,548 | B2 | * | 4/2005 | Yatougo et al. ............. 361/690 |
| 7,038,360 | B2 | * | 5/2006 | Bae et al. .................. 313/46 |
| 7,269,009 | B2 | * | 9/2007 | Ryu et al. ................. 361/692 |
| 7,397,461 | B1 | * | 7/2008 | Graham .................... 345/156 |
| 7,593,226 | B2 | * | 9/2009 | Yamanaka ................. 361/695 |
| 7,667,964 | B2 | * | 2/2010 | Kang et al. ............... 361/692 |
| 8,248,784 | B2 | * | 8/2012 | Nakamichi et al. ........ 361/679.5 |

(Continued)

FOREIGN PATENT DOCUMENTS

| | | |
|---|---|---|
| GB | 2 296 132 | 6/1996 |
| JP | 2003-076286 | 3/2003 |
| WO | WO 2009135308 A1 * | 11/2009 |

OTHER PUBLICATIONS

Extended European Search Report issued in European Patent Application No. 10192287.0 on Sep. 14, 2011.

*Primary Examiner* — Steven B McAllister
*Assistant Examiner* — Jonathan Cotov
(74) *Attorney, Agent, or Firm* — Staas & Halsey LLP

(57) ABSTRACT

A display device including a case having a transparent window that forms one side of a first air flow path, a display unit including a display surface that faces the transparent window to form the other side of the first air flow path, a ventilator to supply air to the first air flow path, and a diffuser disposed at an exit of the first air flow path and having a cross-sectional area that is gradually increased.

21 Claims, 7 Drawing Sheets

(56) References Cited

U.S. PATENT DOCUMENTS

| | | | |
|---|---|---|---|
| 8,274,622 B2* | 9/2012 | Dunn | 349/58 |
| 2003/0050002 A1* | 3/2003 | Pfister | 454/184 |
| 2006/0077636 A1* | 4/2006 | Kim | 361/688 |
| 2007/0007412 A1* | 1/2007 | Wang | 248/284.1 |
| 2008/0062626 A1* | 3/2008 | Ryman et al. | 361/681 |
| 2008/0218446 A1* | 9/2008 | Yamanaka | 345/60 |
| 2009/0086430 A1* | 4/2009 | Kang et al. | 361/695 |
| 2009/0231808 A1* | 9/2009 | Burgner | 361/695 |
| 2009/0244472 A1* | 10/2009 | Dunn | 349/161 |
| 2009/0310059 A1* | 12/2009 | Kim et al. | 349/58 |
| 2010/0171889 A1* | 7/2010 | Pantel et al. | 349/1 |
| 2010/0232107 A1* | 9/2010 | Dunn | 361/695 |
| 2011/0058326 A1* | 3/2011 | Idems et al. | 361/679.21 |
| 2011/0167845 A1* | 7/2011 | Lee et al. | 62/89 |
| 2012/0195002 A1* | 8/2012 | Kamei et al. | 361/695 |

* cited by examiner

DISPLAY DEVICE

CROSS-REFERENCE TO RELATED APPLICATIONS

This application claims priority under 35 U.S.C. §119(a) of Korean Patent Application No. 10-2010-0001325, filed on Jan. 7, 2010, in the Korean Intellectual Property Office, the disclosure of which is incorporated herein in its entirety by reference.

BACKGROUND

1. Field of the Invention

The present general inventive concept relates to a display device with an air flow path to cool a display unit, which may be installed in an indoor, outdoor, or semi-outdoor environments.

2. Description of the Related Art

Recently, display devices have been employing a flat display unit such as a liquid crystal panel, a plasma panel, and a display panel using a light emitting diode (LED) array, which may be used to realize a large-sized screen with a thin thickness.

The large-sized screen and high brightness of a display unit are typically accompanied with increased heat due to increased power demanded by a light source and increased heat from a driving circuit. In particular, as the display device is applied to a public information display (PID) field, demands for large-sized screens and high brightness of the display unit are greatly increased. In addition, when the display device is used in an outdoor environment, a surface temperature of the display unit may be increased due to exposure to solar light. On the other hand, when the display device is used in an indoor environment, the display unit is exposed to the air therein, thus the device may be overcooled, such that its performance may be deteriorated.

SUMMARY

The present general inventive concept provides a display device capable of affective cooling.

Additional features and utilities of the present general inventive concept will be set forth in part in the description which follows and, in part, will be obvious from the description, or may be learned by practice of the present general inventive concept.

The present general inventive concept also provides an improved display device to maintain a preferred operational temperature thereof.

Embodiments of the present general inventive concept provide a display device including a case with a transparent window that forms one side of a first air flow path, a display unit including a display surface that faces the transparent window to form the other side of the first air flow path, a ventilator to supply air to the first air flow path, and a diffuser disposed at an exit of the first air flow path and having a cross-sectional area that is gradually increased.

The first air flow path may be formed vertically.

An interval at an entrance of the first air flow path between the display surface and the transparent window may be broader than that at the exit of the first air flow path between the display surface and the transparent window.

The display device may further include a driving circuit unit at the rear of the display unit; and a second air flow path to cool the driving circuit unit.

The second air flow path may be formed vertically. The display device may further include a guide member that guides air supplied by the ventilator to the first and second air flow paths. The guide member may be disposed at the entrance of the first air flow path and forms an inflow path whose cross-sectional area is gradually decreased.

The case may include an intake port and a discharge port, and the ventilator may be installed in the case. A filter may be installed at the intake port to filter foreign materials.

The display device may further include a temperature detector detecting a temperature inside the case; and a temperature controller controlling a temperature of air supplied by the ventilator.

Embodiments of the present general inventive concept further include a display apparatus including a case having a first side and a second side, a display unit disposed in the case to display an image thereon and to form a first air flow path and second air flow path with the first and second side, respectively, a ventilator to supply air, and a guide member disposed between the ventilator and the display unit to divide and guide the supplied air to the first air flow path and second air flow path.

Embodiments of the present general inventive concept further include a display apparatus including a display case including a transparent window, a display unit including a display surface spaced apart from the transparent window to form a first air flow path, and a rear surface spaced apart from a rear cover of the display case to form a second air flow path, a ventilator to supply air from outside the display case along an intake path, and a wedge-shaped guide surface to guide supplied air towards the first and second airflow paths, wherein the first and second airflow paths are substantially perpendicular to the intake path.

BRIEF DESCRIPTION OF THE DRAWINGS

The above and other features and utilities of the present general inventive concept will become more apparent by describing in detail exemplary embodiments thereof with reference to the attached drawings in which.

DETAILED DESCRIPTION OF THE EXEMPLARY EMBODIMENTS

Figure 1:
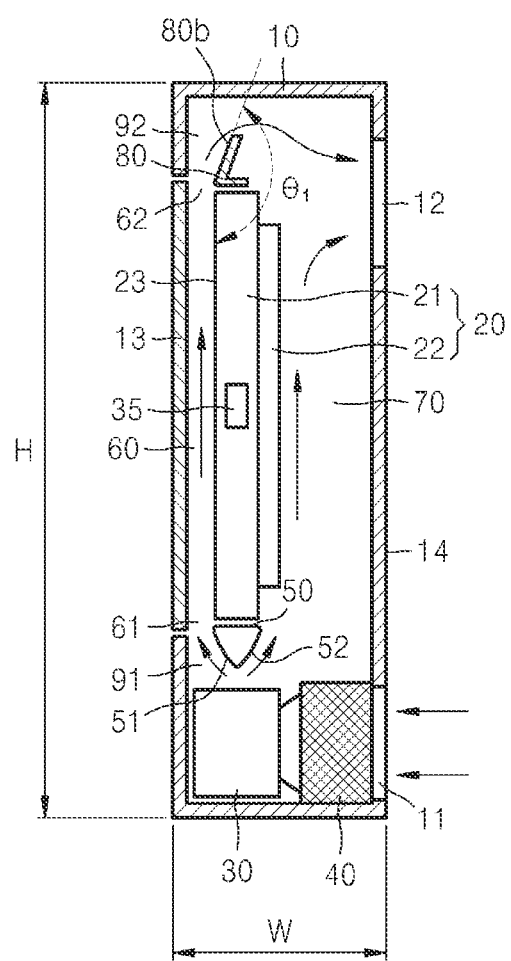
FIG. 1 is a view of a display device according to an exemplary embodiment of the present general inventive concept.

Reference will now be made in detail to the exemplary embodiments of the present general inventive concept, examples of which are illustrated in the accompanying drawings, wherein like reference numerals refer to the like elements throughout. The exemplary embodiments are described below in order to explain the present general inventive concept by referring to the figures.

FIG. 1 is a view of a display device according to an exemplary embodiment of the present general inventive concept. Referring to FIG. 1, the display device includes a case 10, a display unit 20, and a ventilator 30.

The display unit 20 may include a panel 21 and a driving circuit unit 22. The panel 21 may be a flat display panel such as a liquid crystal display (LCD) panel or a plasma display panel. For example, the LCD panel may include a liquid crystal layer injected between transparent top and bottom substrates and top and bottom electrodes installed at the top and bottom substrate, respectively. A light source may be installed at the edge of the bottom substrate and thus the bottom substrate may serve as a light guide panel of a backlight device. In a case of a color LCD panel, at least one color filter may be installed on an optical path. The liquid crystal layer may align in a predetermined direction and an electric signal can be applied from the driving circuit unit 22 to the top and bottom electrodes to change an orientation of the liquid crystal layer, such that an image can be displayed by blocking or transmitting light. The driving circuit unit 22 generates a signal corresponding to an image, and the panel 21 displays the image on the display surface 23 according to the signal of the driving circuit unit 22, which is electrically connected to the panel 21. A structure of the LCD panel or the plasma display panel is well known to those skilled in the art and thus its detailed description will be omitted.

The case 10 can include a transparent window 13. A display surface 23 of the display unit 20 can face the transparent window 13, such that an image generated and displayed on panel 21 is seen by a user through the transparent window 13. The transparent window 13 and the display surface 23 are spaced apart from each other to form a first air flow path 60 to cool the front of the display unit 20. A diffuser 80 can be installed at an exit 62 of the first air flow path 60. A light source device such as a backlight unit (not illustrated) and the driving circuit unit 22 can be installed at the rear of the display unit 20. A second air flow path 70 can serve to cool the rear of the display unit 20 and is defined by a rear cover 14 of the case 10 and the rear of the display unit 20.

As illustrated in FIG. 1, the case 10 has a height H and a width W.

The ventilator 30 can intake air through an intake port 11 and then supply the admitted air to the first and second air flow paths 60 and 70. A filter 40 may be installed at the intake port 11 to filter foreign materials, such as dust in the air, and to prevent the foreign materials from flowing into the case 10. A guide member 50 can guide the air discharged from the ventilator 30 into the first and second air flow paths 60 and 70. The air passing through the first and second air flow paths 60 and 70 can be discharged into a discharge port 12.

The display device of this exemplary embodiment of the present general inventive concept may be installed in an indoor, outdoor, or semi-outdoor environment. The semi-outdoor installation means that a portion of the case 10 including the transparent window 13 is positioned in an outdoor environment.

A main heat source can include the light source device and the driving circuit unit 22 while the display unit 20 operates. In particular, due to an enlarged screen and increased brightness of the display unit 20, heat generated from a light source and heat generated from the driving circuit unit 22 to drive the light source device and the panel 21 can also be increased. For example, in a case of an LCD panel, if a liquid crystal is exposed to a high temperature environment, the performance of the liquid crystal display can be deteriorated. Furthermore, if the display device is used in a public information display (PID) field, radiant heat by solar light may affect the panel 21.

According to the display device of this exemplary embodiment of the present general inventive concept, the first air flow path 60 can be formed between the transparent window 13 and the display surface 23 of the display unit 20 to allow air to pass through. While air passes through the first air flow path 60, the air may directly absorb heat from the display surface 23 of the display unit 20. Accordingly, heat energy delivered from the rear of the display unit 20 to the panel 21 and heat energy delivered from solar light to the display surface 23 of the display unit 20 may be directly dissipated such that cooling affect can be increased. Moreover, the transparent window 13 heated by a radiant energy of solar light can also be cooled.

The first air flow path 60 can extend vertically and the ventilator 30 can supply air from the bottom of the first air flow path 60. While air flows from the entrance 61 of the first air flow path 60 to the exit 62, the air can absorb heat from the display unit 20 and thus the air temperature can increase. The heated air can have an ascending tendency and thus naturally move toward the exit 62. Accordingly, a driving load of the ventilator 30 can be reduced and thus power consumption and noise of the ventilator 30 can also be reduced.

As a flow velocity of air flowing through the first air flow path 60 becomes faster, cooling affect can be further improved. A first guide surface 51 of the guide member 50 can form one side of an inflow path 91 to guide the air supplied by the ventilator 30 to the entrance 61 of the first air flow path 60. In relation to the first guide surface 51, the cross-sectional area of the inflow path 91 can become narrower as approaching the entrance 61 of the first air flow path 60. Then, a flow velocity of air can become faster in the inflow path 91 as the air approaches toward the entrance 61 of the first air flow path 60. Therefore, a cooling affect can be improved.

The diffuser 80 can be installed at the exit 62 of the first air flow path 60. The diffuser 80 can form one side of a discharge flow path 92 for the air discharged from the entrance 62 of the first air flow path 60. In relation to the diffuser 80, a cross-sectional area of the discharge flow path 92 can become broader as being far from the exit 62 of the first air flow path 60. In other words, air exiting the first air flow path 60 has a wider space to travel than while travelling between the transparent window 13 and display unit 20 in the first air flow path 60. Thus, upon leaving the first air flow path 60, the air flow is provided with a broader cross-sectional area to travel toward the discharge port 12 while in the discharge flow path 92. If there is no diffuser 80, the cross-sectional area of the discharge flow path 92 can become drastically broader at the exit 62 of the first air flow path 60, such that a pressure loss can be greatly increased in the discharge flow path 92 and thus, a flow loss can be increased. This increase of the flow loss may cause driving load increase and driving noise increase of the ventilator 30, and thus in order to obtain flow rates of air necessary for cooling, ventilation capacity of the ventilator 30 needs to be increased. A flow rate loss due to the pressure loss can be prevented by the diffuser 80 with a form with which the cross-sectional area of the discharge flow path 92 can become gradually expanded.

Figure 3:
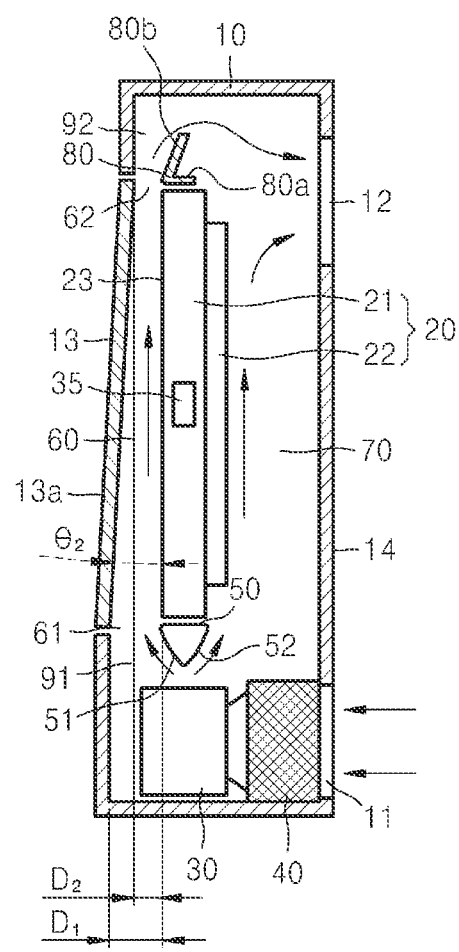
FIG. 3 is a sectional view of a display device with a first air flow path whose cross-sectional area becomes gradually narrower as approaching from an entrance toward an exit according to another exemplary embodiment of the present general inventive concept.

The diffuser 80 contacts the discharge flow path 92 along an upper portion 80b on the diffuser 80, as illustrated in FIG. 3. Further, the upper portion 80b forms an angle $\Theta_1$ with the display surface 23 of the display unit 20, as illustrated in FIG. 1. Additionally, when the transparent window 13 is positioned at a slant, a front surface 13a of the transparent window 13 is positioned at an angle $\ominus_2$ with respect to the display surface 23 of the display unit 20, as illustrated in FIG. 3.

Figure 5:
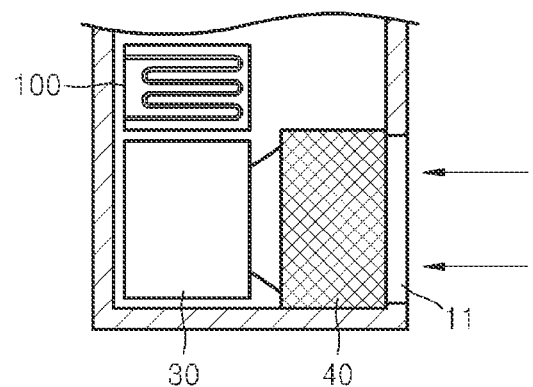
FIG. 5 is a partial sectional view of a display device with a temperature controller according to an exemplary embodiment of the present general inventive concept.
Figure 5A:
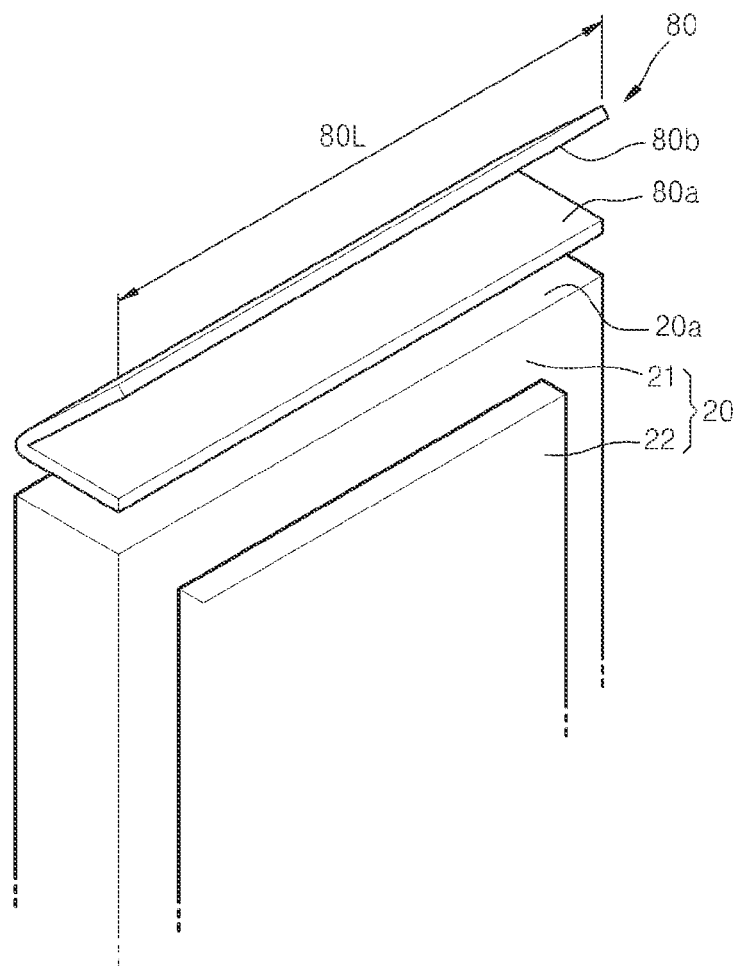
FIGS. 5A and 5B are views illustrating a diffuser at a display device.

The diffuser 80, as illustrated in FIG. 5A, has an L-shape and a length 80L substantially the same as the length of the display unit 20. The diffuser 80 includes a lower portion 80a substantially parallel to an upper surface 20a of the display unit. Also, the diffuser 80 includes the upper portion 80b which serves to increase the cross-sectional area of air travelling in the discharge flow path 92 toward the discharge port 12.

Figure 5B:
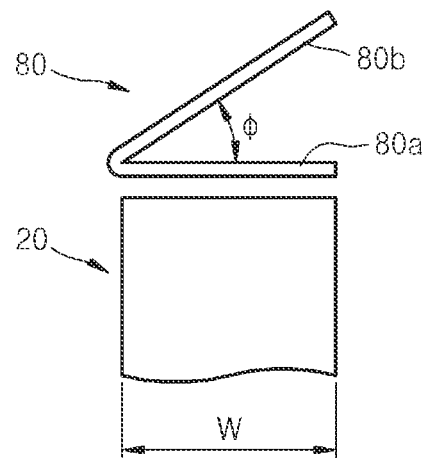

The diffuser, as illustrated in FIG. 5B, forms an angle φ between lower portion 80a and upper portion 80b.

The guide member 50 can further include a second guide surface 52 to guide the air supplied from the ventilator 30 into the second air flow path 70. Air flowing through the second air flow path 70 can contact the light source at the rear of the display unit 20 and the driving circuit unit 22 to absorb heat energy. Accordingly, the light source and the driving circuit unit 22 can be cooled and also the heat energy delivered from the light source and the driving circuit unit 22 to the panel 21 can be reduced.

Figure 6A:
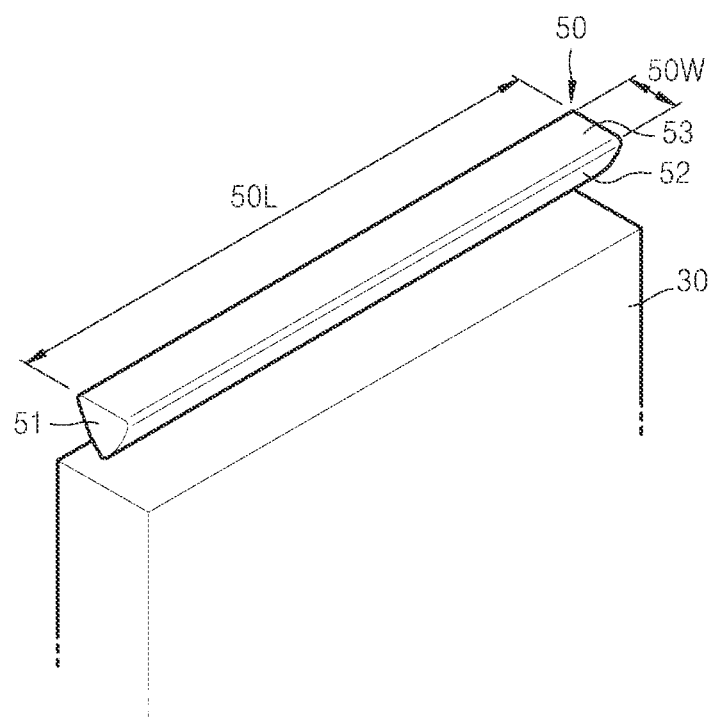
FIGS. 6A and 6B are views illustrating a guide member of a display device.
Figure 6B:
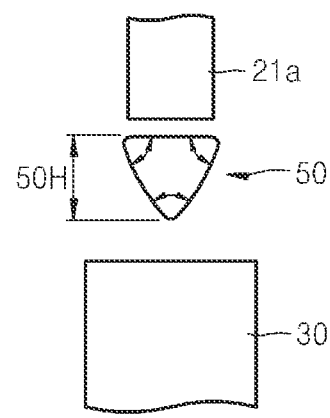

The guide member 50, as illustrated in FIGS. 6A and 6B, has a length 50L, a width 50W, and height 50H. Also, a side 51 of the guide member 50 is positioned substantially perpendicular to the display surface 23 of the display unit 20. Further, curved sides 52 of the guide member 50 face the ventilator 30. Additionally, a side 53 of the guide member 50 substantially faces a lower portion 21a of the panel 21. FIG. 6B also illustrates angles along the side 51 of the guide member 50. Note, the edges of the guide member 50 may have various designs, including straight and rounded edges.

A temperature detector 35 can detect an inner temperature of the display device. Air volume of the ventilator 30 may be adjusted according to the inner temperature detected by the temperature detector 35. One temperature detector 35 can be installed at the display unit 20 in FIG. 1, but this does not limit the scope of the present general inventive concept. If necessary, more than two temperature detectors 35 may be installed in the case 10.

Figure 2:
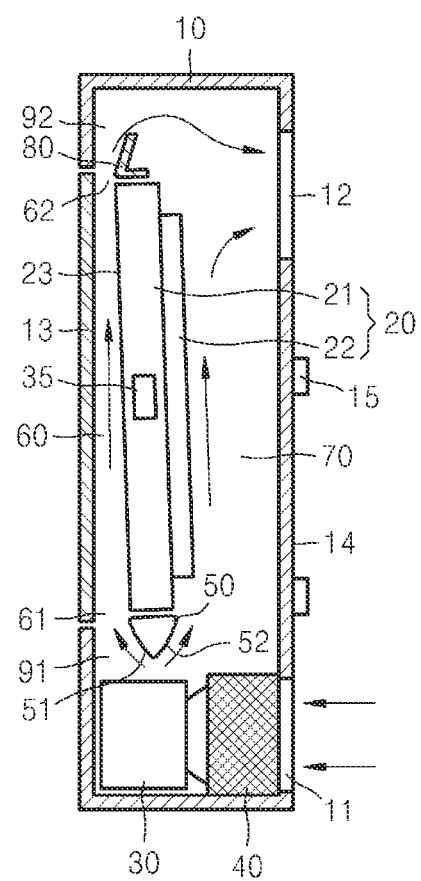
FIG. 2 is a view of a display device according to another exemplary embodiment of the present general inventive concept.
Figure 4:
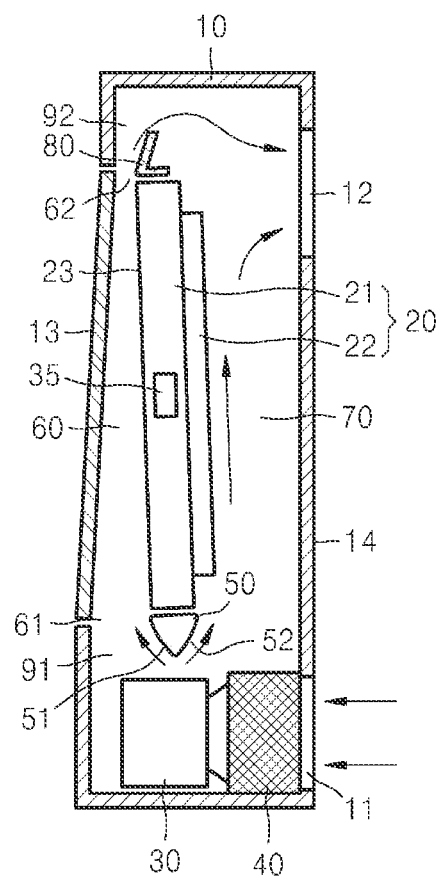
FIG. 4 is a sectional view of a display device with a first air flow path whose cross-sectional area becomes gradually narrower as approaching from an entrance toward an exit according to another exemplary embodiment of the present general inventive concept.

FIG. 2 is a view of a display device according to another exemplary embodiment of the present general inventive concept. Referring to FIG. 2, a cross-sectional area of the first air flow path 60 can become decreased as approaching from the entrance 61 to the exit 62. For this, the display unit 20 can be disposed on a slant, an interval between the display surface 23 and the transparent window 13 at the entrance 61 of the first air flow path 60 may be broader than that between the display surface 23 and the transparent window 13 at the exit 62 of the first air flow path 60. As illustrated in FIG. 3, the cross-sectional area of the first air flow path 60 can become decreased as approaching from the entrance 61 to the exit 62 by slanting the transparent window 13. As further illustrated in FIG. 3, the distance D1 at the entrance of the first air flow path 60 is larger than the distance D2 at the exit of the first air flow path 60. Of course, as illustrated in FIG. 4, both of the display unit 20 and the transparent window 13 may be disposed at a slant.

Since air flowing through the first air flow path 60 can absorb the heat of the display unit 20, the air temperature can gradually increase as approaching from the entrance 61 to the exit 62. When closer to the exit 62, a difference between a temperature of the air and a temperature of the display unit 20 can become smaller such that cooling affect can become decreased. The cooling affect can increase as a flow velocity of the air becomes faster. As mentioned above, if the cross-sectional area of the first air flow path 60 becomes narrower as approaching from the entrance 61 to the exit 62, air inflowing into the first air flow path 60 through the entrance 61 can become gradually faster as approaching the exit 62. Accordingly, excellent cooling affect can be realized at the exit 62 of the first air flow path 60.

If the first air flow path 60 is employed (whose cross-sectional area becomes narrower as approaching from the entrance 61 to the exit 62), a flow velocity of the exit 62 can be faster than that of the entrance 61 in the exemplary embodiment of FIG. 1. In this case, if there is no diffuser 80, a pressure loss due to a drastic change of a cross-sectional area at the exit 62 can be much greater and thus, a flow loss at the exit 62 can also become intense. By installing the diffuser 80 to reduce a flow loss, limitations related to driving load, driving noise, and power consumption of the ventilator 30 can be reduced.

The exemplary embodiments of the present general inventive concept above illustrate a case that natural wind can be used to cool the display unit 20 but the scope of the present general inventive concept is not limited thereto. For example, as illustrated in FIG. 5, a display device may further include a temperature controller 100. The temperature controller 100 may include a cooler to supply cooled air to the first and second flow paths 60 and 70. The cooler may be a typical cooler using a latent heat of refrigerant. In this case, only a heat exchange to cool air (not illustrated) through heat exchange with refrigerant may be installed in the case 10, and a heat exchanger to cool refrigerant (not illustrated) and a compressor (not illustrated) are installed at the external of the case 10 to cool the temperature-increased refrigerant.

Figure 7:
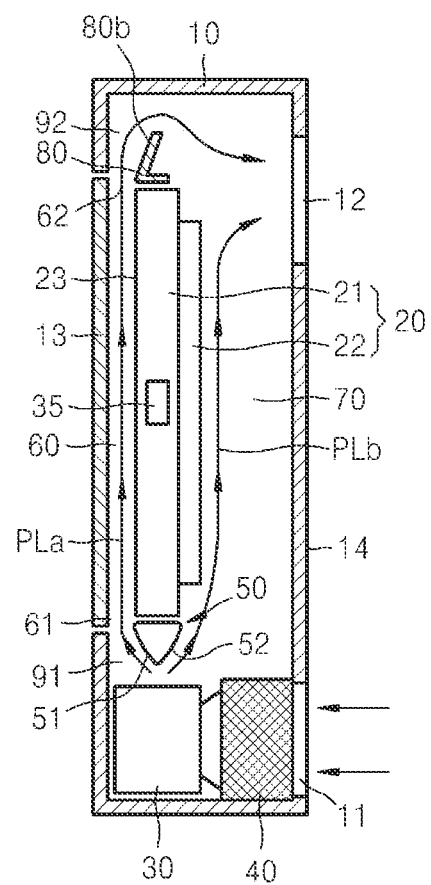
FIG. 7 is a view illustrating a display device according to an embodiment of the present general inventive concept.

As illustrated in FIG. 7, the path length PLa in the first air flow path 60 may be longer than the path length PLb in the second air flow path 70. Also, the heat generated by the driving circuit unit 22 and panel 21 may dissipate from the case 10 at a rate proportional to the rate in which air flows through the case 10.

Support fasteners 15 may be utilized to hang the case 10 from a vertical surface.

When the display device is installed in an outdoor environment, a temperature of a display device may be extremely low during winter. In this case, warm air may need to be supplied to the first and second air flow paths 60 and 70. For this, the temperature controller 100 may include a heater for heating air.

Of course, the temperature controller 100 may include a cooler and a heater simultaneously. If an inner temperature of the case 10 detected by the temperature controller 100 is lower than an operating temperature of the display device, the heater can operate to heat air and supply the heated air to the first and second air flow paths 60 and 70. If an inner temperature of the case 10 detected by the temperature controller 100 is higher than an operating temperature of the display device, the heater can operate to heat air and supply the heated air to the first and second air flow paths 60 and 70

As mentioned above, by being equipped with the temperature controller 100 to adjust a temperature of air supplied to the first and second air flow paths 60 and 70 so as to actively deal with a change of an external environmental condition, operational reliability of the display device can be obtained.

According to the above-mentioned display device, temperature increase of the display device due to a radiant heat of solar light can be reduced by forming the first air flow path between the transparent window and the display surface of the display unit. In addition, the display surface of the display unit can directly contact air such that a cooling affect can be enhanced. Heat transmission effectively can occur at the exit by gradually increasing a flow velocity of air with a cross-sectional area of the first air flow path, which can become narrower in a flow direction of the first air flow path. By disposing the diffuser at the exit of the first air flow path, a flow loss due to a drastic change of the flow cross-sectional area can be reduced and limitations related to driving load, driving noise, and driving power of the ventilator can be reduced also. The front and rear of the display unit can be cooled simultaneously by installing the second air flow path. By forming the first and second air flow paths vertically to allow air to flow from the bottom to the top, smooth air flow can be realized in the first and second air flow paths. By forming the first guide surface to guide the air supplied from the ventilator to the entrance of the first air flow path to have a form with which a cross-sectional area of an inflow path becomes narrower, a flow velocity of the air supplied to the first air flow path can become faster such that cooling affects can be improved. By selectively supplying hot air and cool air to the first and second air flow paths using the temperature detector and the temperature controller, operational reliability of the display device can be improved.

While the present general inventive concept has been particularly illustrated and described with reference to exemplary embodiments thereof, it will be understood by those of ordinary skill in the art that various changes in form and details may be made therein without departing from the spirit and scope of the present general inventive concept as defined by the following claims.

What is claimed is:

1. A display device comprising:
   a case comprising a transparent window that forms one side of a channel defining a first air flow path; and
   a display unit comprising
   a display surface that faces the transparent window to form the other side of the channel defining the first air flow path;
   a ventilator to supply air to the first air flow path; and
   a diffuser disposed at an exit of the channel, the diffuser comprising an angled vane extending away from the exit of the channel, the diffuser forming the entrance of a discharge flow path whose cross-sectional area is gradually increased along the vane of the diffuser, the discharge flow path being defined by the case and a distal end of the vane of the diffuser, the air exiting the first air flow path being passively guided along the vane of the diffuser.

2. The display device of claim 1, wherein the first air flow path is formed vertically.

3. The display device of claim 1, wherein an interval at an entrance of the first air flow path between the display surface and the transparent window is broader than the interval at the exit of the first air flow path between the display surface and the transparent window.

4. The display device of claim 1, further comprising:
   a driving circuit unit at the rear of the display unit; and
   a second air flow path to cool the driving circuit unit.

5. The display device of claim 4, wherein the second air flow path is formed vertically.

6. The display device of claim 4, further comprising:
   a guide member to guide air supplied by the ventilator to the first and second air flow paths.

7. The display device of claim 6, wherein the guide member is disposed at the entrance of the first air flow path and forms an inflow path whose cross-sectional area is gradually decreased.

8. The display device of claim 1, wherein the case comprises an intake port and a discharge port, and the ventilator is installed in the case.

9. The display device of claim 8, wherein a filter is installed at the intake port to filter foreign materials.

10. The display device of claim 1, further comprising:
    a temperature detector to detect a temperature inside the case; and
    a temperature controller to control a temperature of air supplied by the ventilator.

11. The display device of claim 1, wherein:
    a front side of the case includes the transparent window; and
    the front side of the case and the diffuser define the cross-sectional area of the discharge flow path.

12. A display apparatus comprising:
    a case having a first side and a second side;
    a display unit disposed in the case to display an image thereon and having a first side and a second side to form a first air flow path and second air flow path with the first side and second side of the case, respectively;
    a ventilator to supply air;
    a guide member disposed between the ventilator and the display unit, the guide member being disposed between the first and second sides of the display unit, to divide and guide the supplied air to the first air flow path and second air flow path; and
    a diffuser disposed between the first air flow path and discharge port, the diffuser comprising an angled vane extending away from an exit of the first air flow path, the air exiting the first air flow path being passively guided along the vane of the diffuser to a discharge flow path defined by the case and a distal end of the vane of the diffuser.

13. The display apparatus of claim 12, wherein the case has a discharge port to discharge the air from the first air flow path and second air flow path.

14. The display apparatus of claim 13, wherein the diffuser minimizes pressure loss at the exit of the first air flow path.

15. The display apparatus of claim 12, wherein the first air flow path has a cross-sectional area varying according to a distance from the ventilator.

16. The display apparatus of claim 12, further comprising a transparent window positioned along a perimeter of the case to allow a user to view a display surface on the display unit.

17. The display apparatus of claim 16, wherein the transparent window is positioned at an angle with respect to the display surface on the display unit.

18. A display apparatus comprising:
    a display case comprising a transparent window; and
    a display unit comprising
    a display surface spaced apart from the transparent window to form a channel defining a first air flow path; and
    a rear surface spaced apart from a rear cover of the display case to form a second air flow path;
    a ventilator to supply air from outside the display case along an intake path;
    a diffuser to minimize pressure loss at the exit of the channel by gradually increasing a cross-sectional area of a discharge flow path along an angled vane of the diffuser extending away from the exit of the channel, the discharge flow path being defined by the display case and a distal end of the vane of the diffuser, the air exiting the first air flow path being passively guided along the vane of the diffuser; and
    a guide surface to guide supplied air towards the first air flow path and towards the second air flow path.

19. The display apparatus of claim 18, wherein the space between the display surface and the transparent window is reduced as supplied air travels along the first air flow path.

20. The display apparatus of claim 18, wherein a front surface on the transparent window to view the display unit is positioned at an angle with respect to a front surface of the display unit.

21. The display apparatus of claim 18, further comprising:
   a temperature cooler positioned above the ventilator to cool supplied air released from the ventilator.

* * * * *